United States Patent
Goatley et al.

(10) Patent No.: US 11,096,268 B2
(45) Date of Patent: Aug. 17, 2021

(54) MOTOR POWER PACK WITH OVERMOLDED PRINTED CIRCUIT BOARD INTEGRATED CONNECTOR

(71) Applicant: Dura Operating, LLC, Auburn Hills, MI (US)

(72) Inventors: Michael Goatley, Ortonville, MI (US); Brian Howe, Shelby Township, MI (US)

(*) Notice: Subject to any disclaimer, the term of this patent is extended or adjusted under 35 U.S.C. 154(b) by 302 days.

(21) Appl. No.: 16/047,722

(22) Filed: Jul. 27, 2018

(65) Prior Publication Data

US 2020/0037432 A1    Jan. 30, 2020

(51) Int. Cl.
| | |
|---|---|
| *H05K 1/02* | (2006.01) |
| *H02K 11/215* | (2016.01) |
| *H02K 9/22* | (2006.01) |
| *H05K 1/18* | (2006.01) |
| *H05K 7/20* | (2006.01) |
| *H02K 29/08* | (2006.01) |
| *H02K 11/33* | (2016.01) |

(52) U.S. Cl.
CPC ............ *H05K 1/0203* (2013.01); *H02K 9/22* (2013.01); *H02K 11/215* (2016.01); *H02K 29/08* (2013.01); *H05K 1/181* (2013.01); *H05K 7/209* (2013.01); *H02K 11/33* (2016.01); *H02K 2211/03* (2013.01); *H05K 2201/066* (2013.01); *H05K 2201/10151* (2013.01); *H05K 2203/1316* (2013.01)

(58) Field of Classification Search
CPC ...... H05K 1/0203; H05K 1/181; H05K 7/209; H05K 2201/066; H05K 2201/10151; H05K 2203/1316; H02K 2211/03; H02K 11/215; H02K 11/33; H02K 9/22; H02K 29/08

See application file for complete search history.

(56) References Cited

U.S. PATENT DOCUMENTS

| | | | |
|---|---|---|---|
| 5,155,579 A | 10/1992 | AuYeung | |
| 5,327,064 A | 7/1994 | Arakawa et al. | |
| 7,629,716 B2 | 12/2009 | Neal | |
| 10,424,991 B2 * | 9/2019 | Yamasaki | H02K 11/33 |

(Continued)

FOREIGN PATENT DOCUMENTS

EP    2256908 B1    4/2018

*Primary Examiner* — Kyle J Moody
*Assistant Examiner* — Jye-June Lee
(74) *Attorney, Agent, or Firm* — Vivacqua Crane

(57) ABSTRACT

A motor electronics unit includes a printed circuit board having a first side and a second side with electronic components connected to the printed circuit board. An electrical conductor is connected to the printed circuit board. A heat sink is connected to the printed circuit board. A pre-molded electrical connector shroud has a portion of the electrical conductor positioned within the electrical connector shroud. A housing has an endcap, both co-molded in a low pressure injection molding process of a thermally conductive polymeric material. The endcap encapsulates the printed circuit board including the electronic components connected to the printed circuit board and covers a first portion of the heat sink, with a second portion of the heat sink uncovered by the polymeric material of the endcap to permit heat transfer away from the printed circuit board. The endcap also encapsulates a portion of the electrical connector shroud.

18 Claims, 8 Drawing Sheets

(56) References Cited

U.S. PATENT DOCUMENTS

| | | |
|---|---|---|
| 2003/0034557 A1 | 2/2003 | Gupta et al. |
| 2006/0164811 A1 | 7/2006 | Maxwell et al. |
| 2012/0031215 A1 | 2/2012 | Feier |
| 2013/0058044 A1* | 3/2013 | Watanabe .......... H05K 7/20854 361/714 |
| 2015/0171709 A1* | 6/2015 | Ito .......................... H02K 11/33 310/52 |
| 2015/0333603 A1 | 11/2015 | von Willich et al. |
| 2016/0347353 A1* | 12/2016 | Wada ..................... H02K 11/33 |
| 2018/0083510 A1 | 3/2018 | Purohit et al. |
| 2019/0103788 A1* | 4/2019 | Iwasaki ................. H02K 11/33 |
| 2020/0036265 A1* | 1/2020 | Goatley ................ H02K 11/33 |

\* cited by examiner

MOTOR POWER PACK WITH OVERMOLDED PRINTED CIRCUIT BOARD INTEGRATED CONNECTOR

FIELD

The present disclosure relates generally to electrical components including electrical motors used in motor vehicles.

BACKGROUND

The statements in this section merely provide background information related to the present disclosure and may or may not constitute prior art.

ISO 26262, titled "Road vehicles—Functional safety", is an international standard defining functional safety requirements of electrical and electronic systems in production automobiles defined by the International Organization for Standardization (ISO). To meet the requirements of ISO 26262, electrical and electronic components such as motors and electrical systems must meet redundancy and functionality requirements after failure. Presently, a failure mode for which no redundancy and functionality after failure are provided occurs for electrical components such as motors and motor power packs when subjected to water impingement, and particularly when immersed in water.

The electrical components of a motor or actuator such as for power steering systems, transmission actuators and the like, including the motor, conductors and sensors, are normally enclosed within an air-filled cavity of a housing. The cavity is sealed to atmosphere using a sealing member such as a gasket. Such heat generating components are particularly susceptible to moisture entrance and subsequent failure when a hot component is immersed or splashed with water, which rapidly cools the component housing, allowing contraction of a portion of the sealed housing causing distortion of the gasket sealing area and therefore for moisture to enter past a sealing member such as a gasket.

Thus, while current automobile vehicle electrical and electronic systems achieve their intended purpose, there is a need for a new and improved system and method for sealing electrical components such as motor power packs with housings.

SUMMARY

According to several aspects, a motor electronics unit, includes a printed circuit board. At least one electrical conductor is connected to the printed circuit board. A heat sink is positioned proximate to the printed circuit board. A pre-molded electrical connector shroud has a portion of the least one electrical conductor positioned within the electrical connector shroud. A housing molded from a low pressure injection molded thermally conductive polymeric material includes: a first endcap portion partially encapsulating the printed circuit board; and a second endcap portion encapsulating a first section of the electrical connector shroud.

In another aspect of the present disclosure, a second section of the electrical connector shroud extends out an end surface of the housing and freely away from the housing.

In another aspect of the present disclosure, the first section of the electrical connector shroud defines a flange extending around a perimeter of the electrical connector shroud.

In another aspect of the present disclosure, the flange includes a step, the step encapsulated by the second endcap portion.

In another aspect of the present disclosure, the at least one electrical conductor defines first and second input electrical power conductors supplying power to the printed circuit board.

In another aspect of the present disclosure, the at least one electrical conductor defines multiple pins transmitting communication signals.

In another aspect of the present disclosure, the circuit board has a first side and a second side with the electrical connector shroud extending away from the first side; and a sensor is positioned on the second side of the printed circuit board sensing a position of a motor shaft.

In another aspect of the present disclosure, the sensor is a Hall Effect sensor.

In another aspect of the present disclosure, the housing includes a substantially solid inner body; and a recess is created in the substantially solid inner body which receives a portion of the motor shaft, with the sensor positioned within the recess so that the sensor is not encapsulated by the substantially solid inner body of the housing.

In another aspect of the present disclosure, a first portion of the heat sink defining a flange is overmolded to fix the heat sink to the printed circuit board, and a second portion of the heat sink extends outward from an end surface of the housing, the second portion having multiple fins.

In another aspect of the present disclosure, the housing includes a housing portion filling a gap between the printed circuit board and the heat sink.

In another aspect of the present disclosure, the housing includes a substantially solid inner body; and a portion of the at least one electrical conductor is encapsulated by the substantially solid inner body.

In another aspect of the present disclosure, the housing includes a substantially solid inner body having a motor cavity receiving an electrical motor when the motor electronics unit is connected to the electrical motor; and a cross contact is positioned within the motor cavity and is connected to the at least one electrical conductor and to the motor to electrically connect the printed circuit board to the motor.

According to several aspects, a motor electronics unit includes a printed circuit board having a first side and a second side and electronic components connected to the printed circuit board. At least one electrical conductor is connected to the printed circuit board. A heat sink is connected to the printed circuit board. A pre-molded electrical connector shroud has a portion of the least one electrical conductor positioned within the electrical connector shroud. A housing has an endcap, both co-molded in a low pressure injection molding process of a thermally conductive polymeric material. The endcap encapsulates the printed circuit board including the electronic components connected to the printed circuit board and covers a first portion of the heat sink, with a second portion of the heat sink uncovered by the polymeric material of the endcap to permit heat transfer away from the printed circuit board. The endcap also encapsulates a portion of the electrical connector shroud.

In another aspect of the present disclosure, the endcap encapsulates a first section of the at least one electrical conductor.

In another aspect of the present disclosure, the housing includes a substantially solid inner body; and a second section of the at least one electrical conductor is encapsulated by the substantially solid inner body.

In another aspect of the present disclosure, the endcap extends in a direction perpendicular to the printed circuit board; and the heat sink includes a step portion completely encapsulated by the endcap.

In another aspect of the present disclosure, the first side of the printed circuit board includes at least one field-effect transistor positioned in in a predetermined area and electrically connected to the at least one electrical conductor, with the heat sink positioned above the predetermined area.

In another aspect of the present disclosure, the at least one field-effect transistor defines multiple field-effect transistors spaced from the heat sink to define a gap, the gap filled with overmolded material of the housing or other thermally conductive material.

According to several aspects, a motor electronics unit includes a printed circuit board having a first side and a second side and having electronic components connected to the printed circuit board. At least one electrical conductor is connected to the first side of the printed circuit board. A heat sink is connected to the first side of the printed circuit board. A pre-molded electrical connector shroud has a portion of the least one electrical conductor positioned within the electrical connector shroud. A housing has an endcap, both co-molded in a low pressure injection molding process of a thermally conductive polymeric material. The endcap encapsulates the printed circuit board including the electronic components connected to the printed circuit board and covers a first portion of the heat sink, with a second portion of the heat sink uncovered by the polymeric material of the endcap to permit heat transfer away from the printed circuit board. The endcap encapsulates a portion of the electrical connector shroud. The endcap encapsulates a first section of the at least one electrical conductor. The at least one electrical conductor extends from an inner surface of the housing and does not extend beyond a mating surface of the housing.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses.

Figure 1:
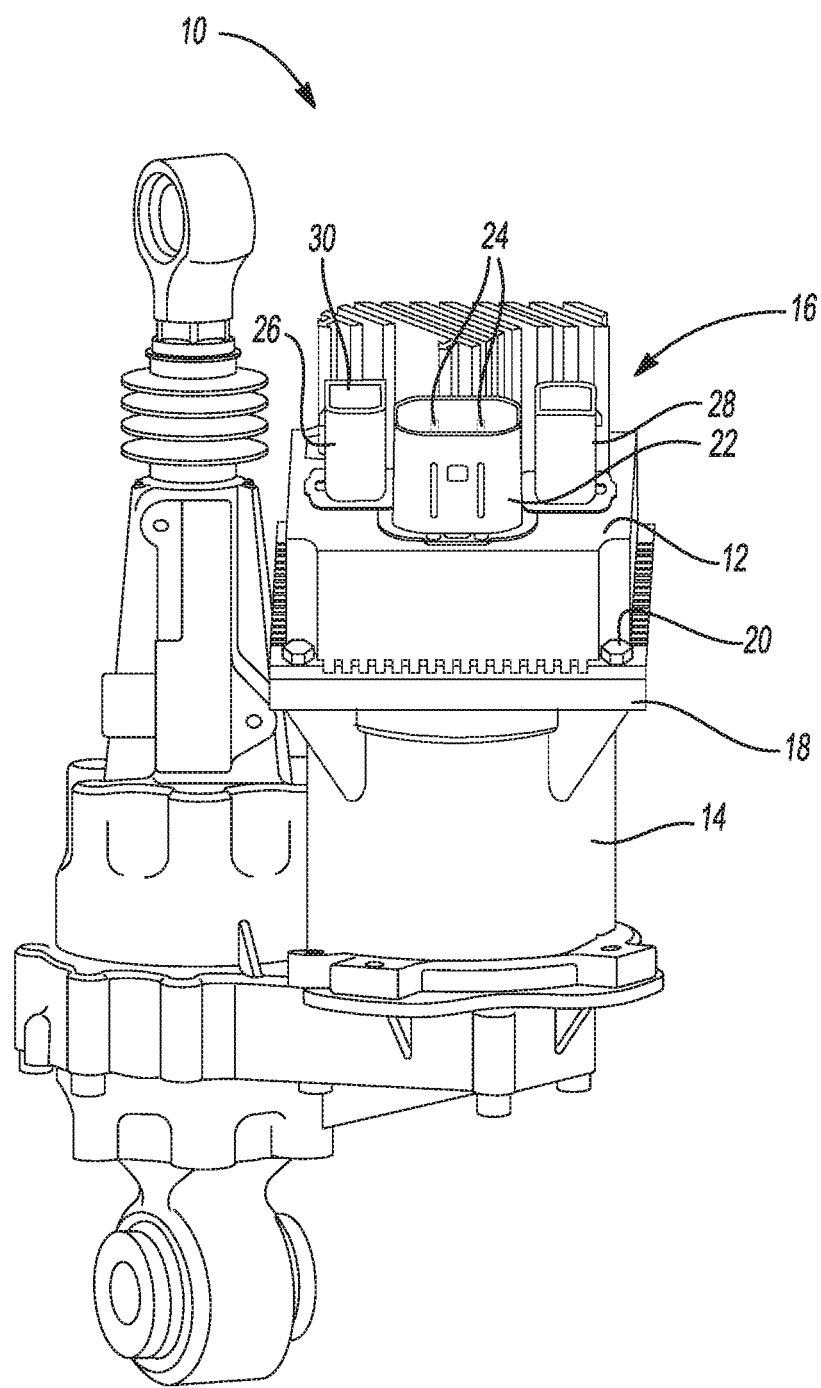
FIG. 1 is a front elevational perspective view of a steering system actuator having a motor and actuator assembly according to an exemplary embodiment.

Referring to FIG. 1, an exemplary motor and actuator assembly 10 includes a motor electronics unit 12 of the present disclosure having an overmolded printed circuit board and an integrated connector described in greater detail below. As used herein, "overmold" or "overmolded" is defined as an injection or a low pressure molding process where one material, typically a thermoplastic material is molded onto a second material, typically a rigid polymeric material such as a printed circuit board, the electronic components mounted to the printed circuit board, or a metal component such as an electrical conductor. The motor electronics unit 12 is attached to an electric motor 14 to create for example a motor vehicle steering actuator assembly 16. The motor electronics unit 12 can also be used in conjunction with other types of electric motors, and can be used in multiple motor or actuator assemblies.

In the exemplary embodiment, the motor electronics unit 12 is mounted to a motor mounting flange 18 of the motor 14 using multiple fasteners 20. The motor electronics unit 12 includes multiple electrical connector bodies such as a power connector body 22 adapted to provide connectivity to motor power connectors 24. The electrical connector bodies further include a communication pin connector body 26 and an external sensor pin connector body 28. Adapters such as an external sensor pin adapter 30 can be connected to the external sensor pin connector body 28. According to several aspects, each of the connector bodies defines a connector shroud positioned around a conductor described in reference to FIG. 3 for attachment to an electrical connector.

Referring to FIG. 2 and again to FIG. 1, according to several aspects the motor electronics unit 12 includes a rectangular-shaped housing 32 having an integral mounting flange 34 to mate with the motor 14. Although an exemplary rectangular-shape is shown for the housing 32, the housing 32 can have any desired geometric shape. The mounting flange 34 includes multiple apertures 36 which individually receive one of the fasteners 20. A heat sink 38 is fixed to the motor electronics unit 12 during an injection molding operation and partially extends outward of the housing 32 of the motor electronics unit 12 defining a sealed perimeter 40 where a polymeric material of the motor electronics unit 12 bonds to the heat sink 38 defining an adhesion bond 42. Each of the power connector body 22, the communication pin connector body 26 and the external sensor pin connector body 28 extend upwardly as viewed in FIG. 3 away from an upper surface 44 of the housing 32.

Figure 2:
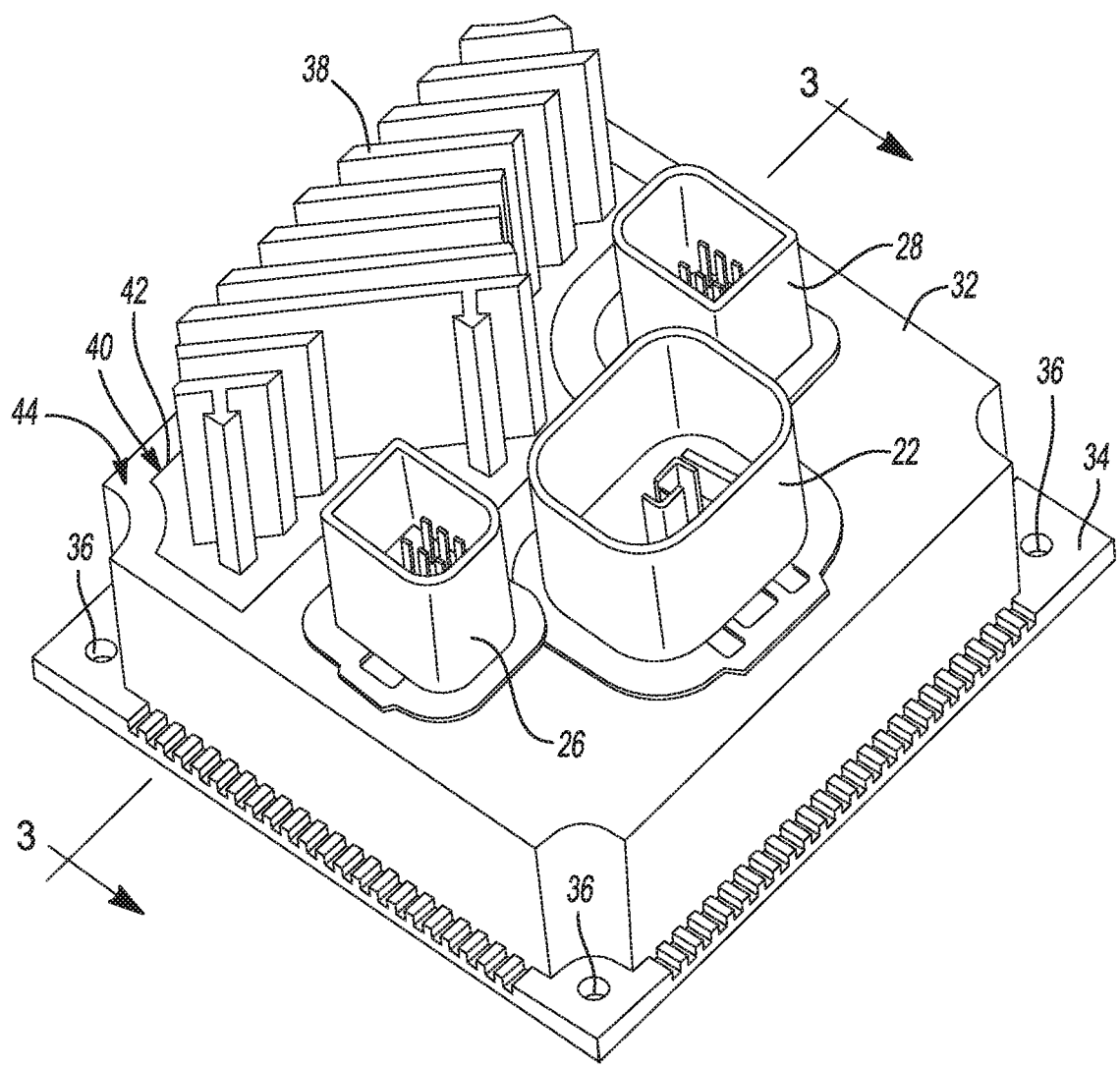
FIG. 2 is a top perspective view of the motor and actuator assembly of FIG. 1.

Referring to FIG. 3 and again to FIGS. 1 through 2, in order for the components contained within the housing 32 to be protected against moisture entrance, the polymeric material which forms and fills the housing 32 must have a similar or identical coefficient of thermal expansion as the polymeric materials within the housing 32. According to several aspects, the polymeric material of the housing 32 defines a thermoset, inorganic filled epoxy molding compound material, such as Epoxidur® EP 3581 X, available from Raschig GmbH of Ludwigshafen, Germany. The power connector body 22 includes a bore 46 which has input electrical power conductors 48, 50 positioned within the bore 46. Similarly, the communication pin connector body 26 includes a bore 52 which has multiple communication pins 54 freely extending into the bore 52, and the external sensor pin connector body 28 includes a bore 56 which has multiple external sensor pins 58 freely extending into the bore 56.

A printed circuit board 60 is completely overmolded with the polymeric material of the housing 32 during injection molding of the housing 32 such that the printed circuit board 60 is fixed within a substantially solid inner body 62 of the housing 32. Each of the communication pins 54 and the external sensor pins 58 are mounted to the printed circuit board 60 prior to positioning the printed circuit board 60 in a mold (not shown) of an injection molding machine (not shown). Portions of the communication pins 54 and the external sensor pins 58 that do not freely extend into either the bore 52 or the bore 56 are therefore also partially overmolded and fixed within the solid inner body 62 of the housing 32.

According to several aspects, each of the power connector body 22, the communication pin connector body 26 and the external sensor pin connector body 28 are formed of the same polymeric material which may be the same or a different polymeric material as the housing 32. Each of the power connector body 22, the communication pin connector body 26 and the external sensor pin connector body 28 include a flange 64 connected to the housing 32 using an epoxy layer 66 during or after an injection molding procedure to form the housing 32. The epoxy layer 66 therefore seals each of the power connector body 22, the communication pin connector body 26 and the external sensor pin connector body 28 to the housing 32 such that the power connector body 22, the communication pin connector body 26 and the external sensor pin connector body 28 define environmentally sealed extensions of the housing 32.

A portion of the solid inner body 62 of the housing 32 is omitted to create a motor cavity 68 at the time of injection molding and is sized to slidably receive an end portion including a motor shaft of the motor 14. The solid inner body 62 prevents any moisture which may enter the motor cavity 68 from directly contacting the printed circuit board 60 and any components mounted on the printed circuit board 60 (discussed in reference to FIG. 4) or from directly contacting the communication pins 54 and the external sensor pins 58. According to several aspects, each of the connector bodies including the power connector body 22, the communication pin connector body 26 and the external sensor pin connector body 28 extend outward and away from the heat sink 38 and in a direction perpendicular to the printed circuit board 60.

Figure 3:
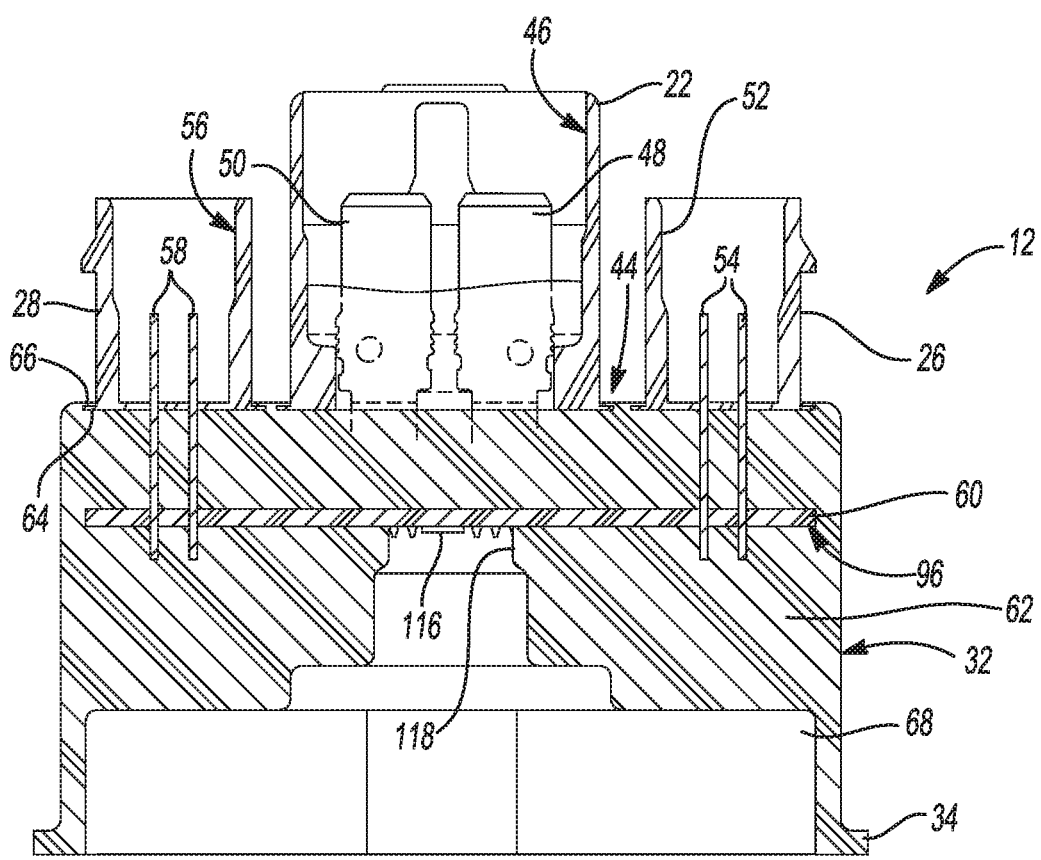
FIG. 3 is a front elevational cross sectional view taken at section 3 of FIG. 2.
Figure 8:
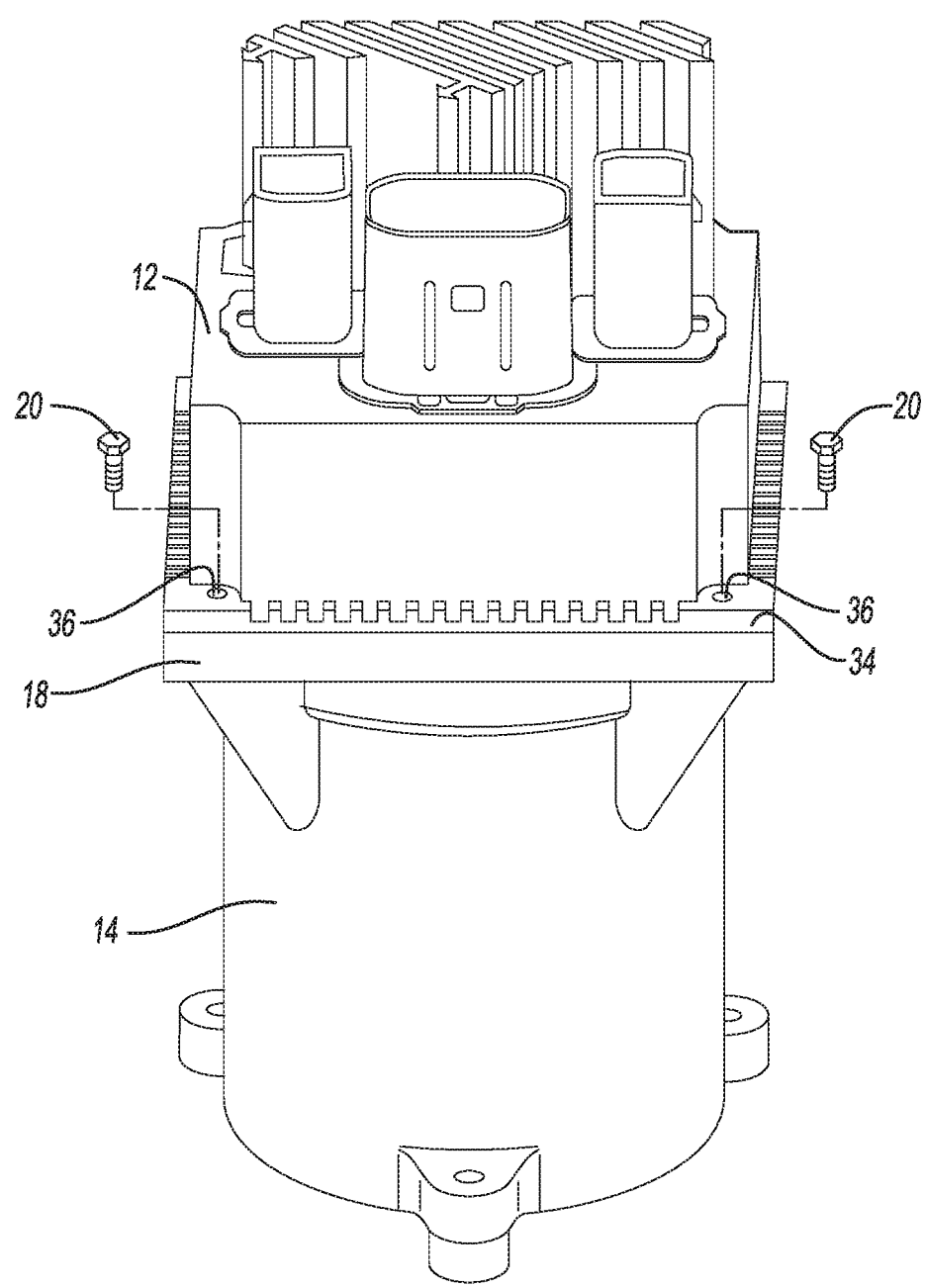
FIG. 8 is a front perspective assembly view of the motor electronics unit of FIG. 5 after assembly with the electrical motor of FIG. 7.

Referring to FIG. 4 and again to FIG. 3, a first side or top surface 70 of the printed circuit board 60 includes several "keepout" areas 72 or zones which are retained free of electronic components. In addition, multiple press-fit areas 74 are retained for installation of friction or compliant-fit electrical pins such as the communication pins 54 and the external sensor pins 58 which may be friction fit or may be soldered connections to the printed circuit board 60. The first side or top surface 70 of the printed circuit board 60 provides multiple field effect transistors 76 positioned in a predetermined area 78, each electrically connected to output conductors 80, 80', 80" described in reference to FIG. 5 for connection to a motor stator of the motor 14 that extend from the housing 32, and the heat sink 38 is positioned above the predetermined area 78. The field effect transistors 76 are also spaced from the heat sink 38 to define a portion of a predetermined spacing 82 described in reference to FIG. 8, the predetermined spacing 82 being filled with the overmold polymeric material of the housing 32 or other thermally conductive material. An integrated circuit installation area 84 is also reserved.

Referring to FIG. 5 and again to FIGS. 1 through 4, a completed and molded motor electronics unit 12 includes polymeric material of the solid inner body 62 of the housing 32 also overmolded onto an upper surface 86 of the printed circuit board 60, including over and onto multiple electronic components 88 mounted on the printed circuit board 60. The heat sink 38, which may be made of a heat conductive metal such as aluminum, includes a flange 90 overmolded by and therefore embedded in the molded polymeric material also covering the printed circuit board 60. The heat sink 38 is thereby hermetically sealed about its perimeter at the contact face with the printed circuit board 60, while permitting outward exposure of multiple raised ribs defining cooling fins 92 of the heat sink 38. Each of three motor electrical output conductors 80, 80', 80" shown and described in greater detail in reference to FIG. 6 are individually coupled to one of three cross contacts 94, shown and described in greater detail in reference to FIG. 7, and positioned within the motor cavity 68, which electrically connect the printed circuit board 60 to the motor 14.

Figure 4:
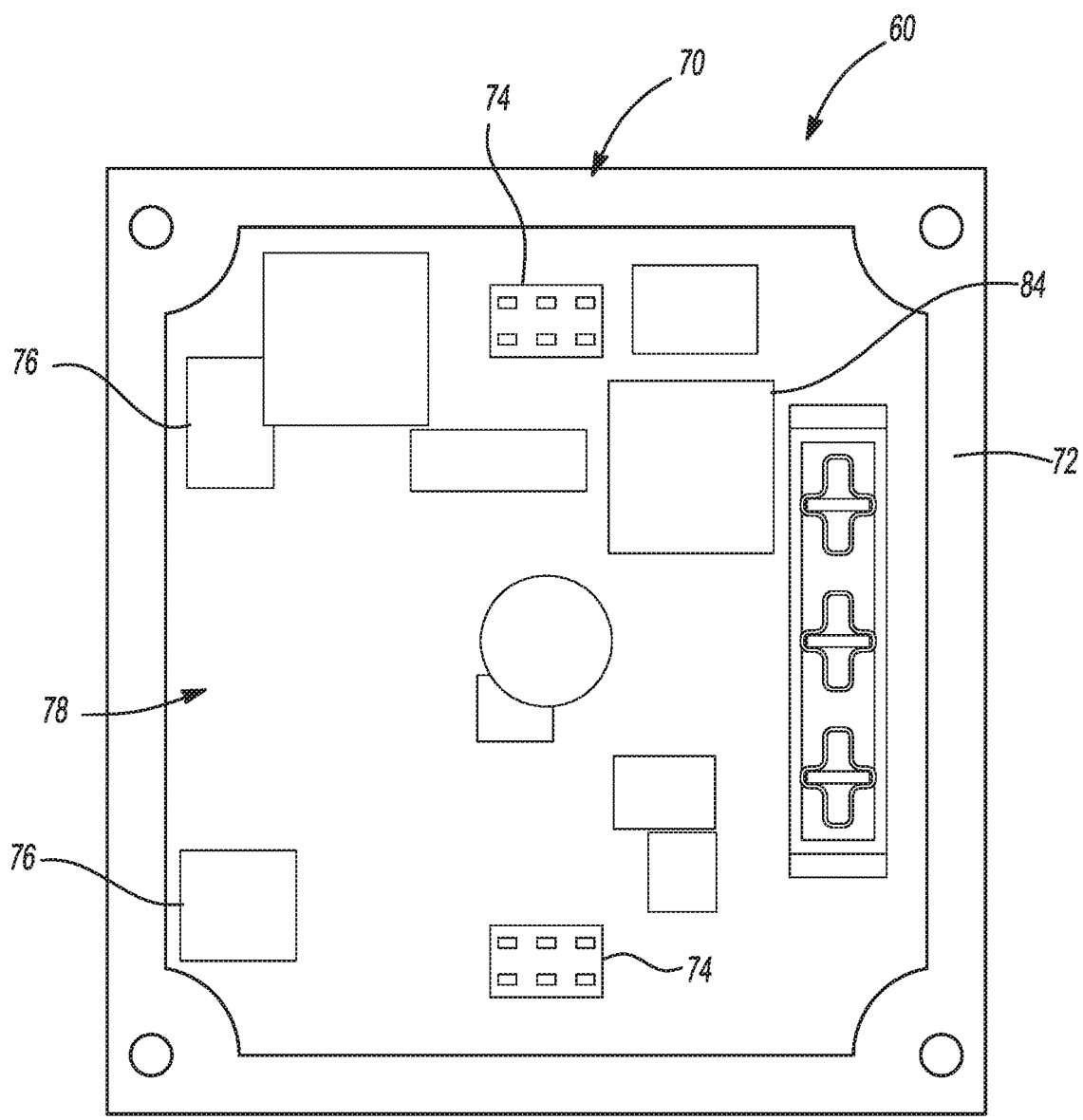
FIG. 4 is a top plan view of a printed circuit board of the motor and actuator assembly of FIG. 1.
Figure 5:
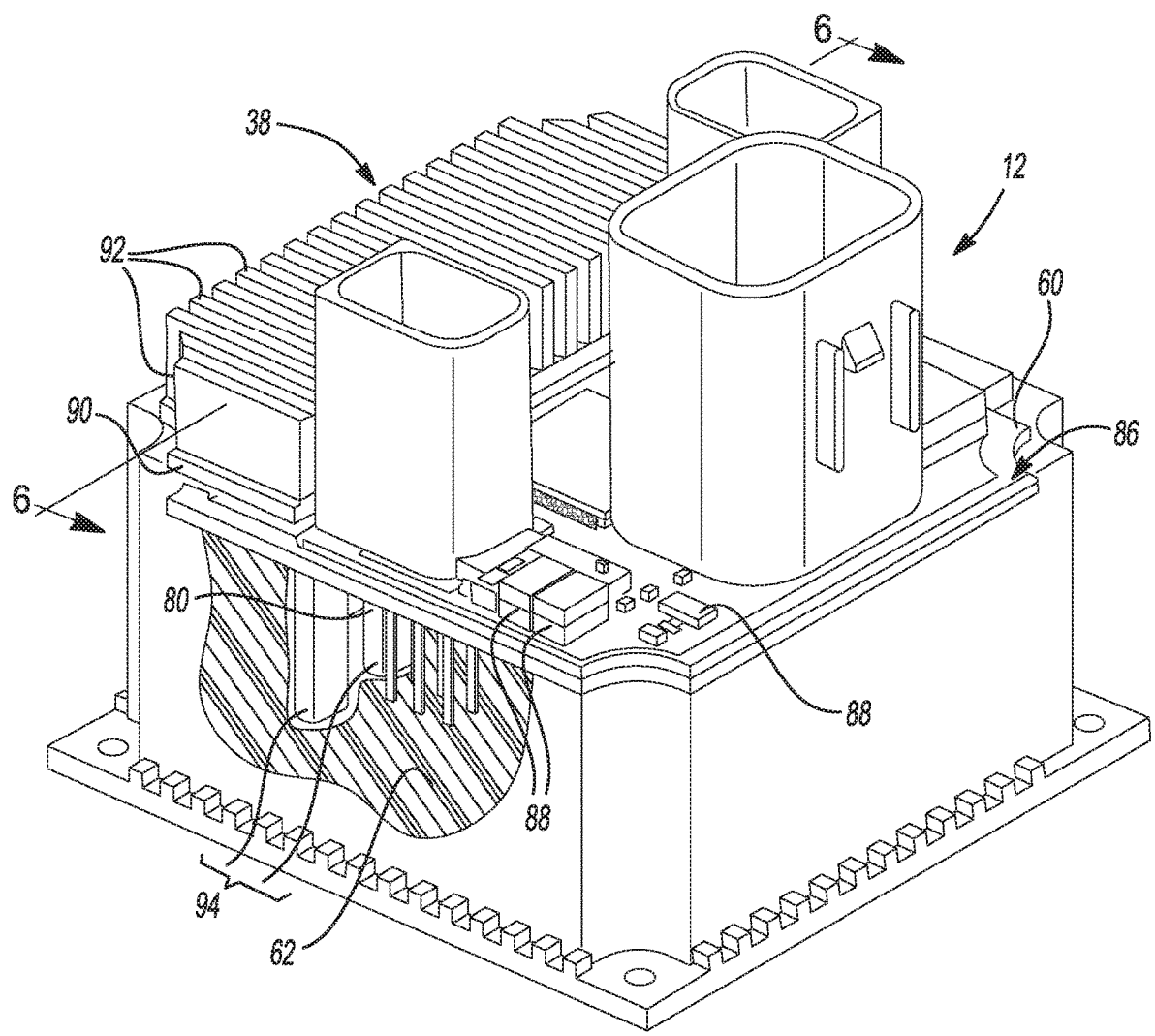
FIG. 5 is a front perspective view of a completed motor and actuator assembly of FIG. 1.
Figure 6:
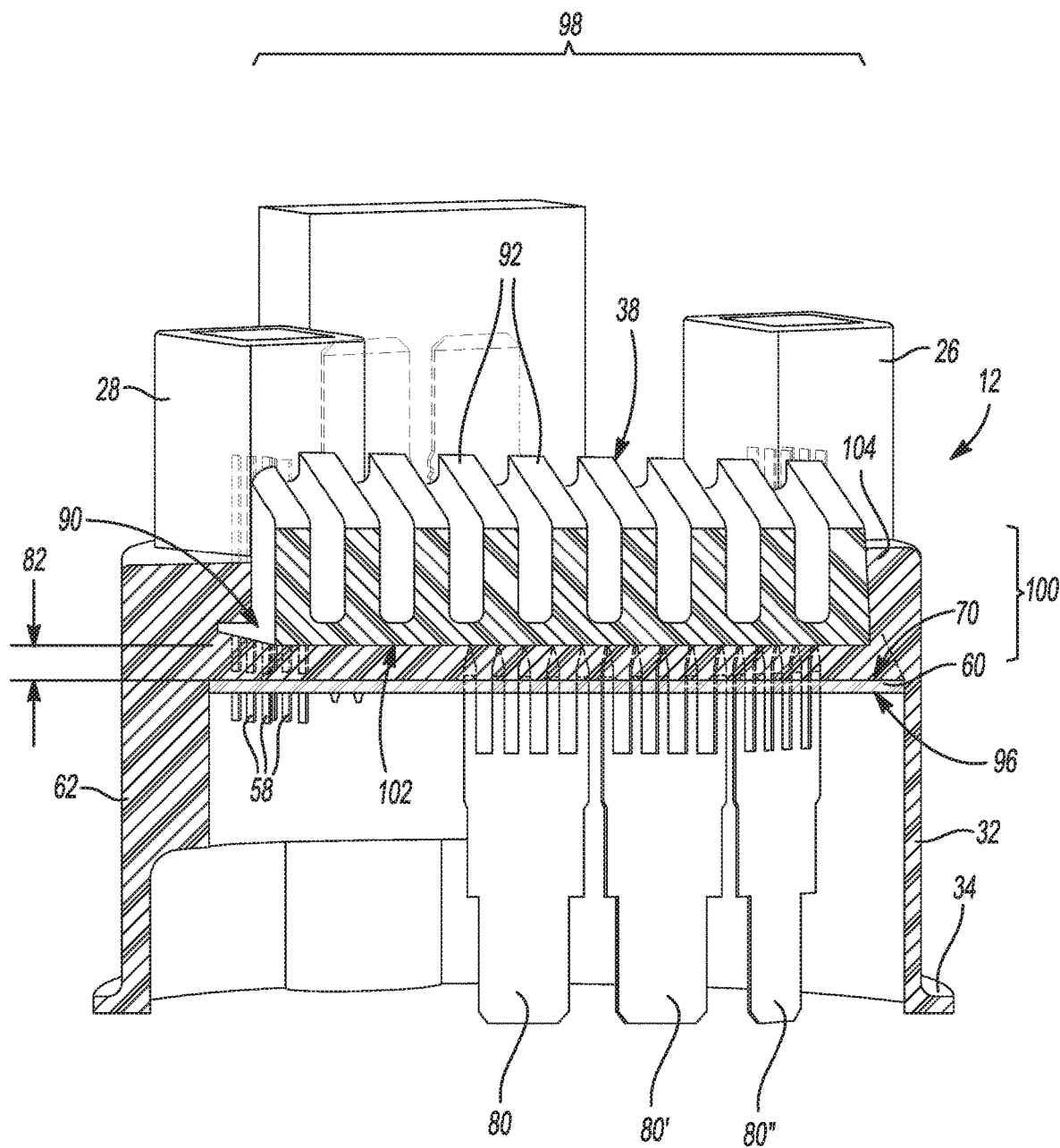
FIG. 6 is a front elevational cross sectional view taken at section 6 of FIG. 5.

Referring to FIG. 6 and again to FIGS. 3 through 5, each of the three motor electrical output conductors 80, 80', 80" are positioned on and extend away from a bottom surface 96 of the printed circuit board 60. The three motor electrical output conductors 80, 80', 80" are fixed to the printed circuit board 60 for example by soldering into apertures created in one of the keepout areas 72 of the printed circuit board 60. The heat sink 38 is positioned proximate to the top surface 70 of the printed circuit board 60 and retained at the predetermined spacing 82 away from the top surface 70. An exposed portion 98 of the heat sink 38 provides the multiple cooling fins 92 facing away from the top surface 70. With the components including the heat sink 38 in position as shown, a printed circuit board assembly 100 is created which is placed in a die (not shown) of an injection molding machine and the polymeric material of the housing 32 of the motor electronics unit 12, typically in pellet form, is pre-heated to a melting point and fed into an injection barrel for injection into the mold.

The predetermined spacing 82 defines a gap between a printed circuit board facing surface 102 of the heat sink 38 and the top surface 70 of the printed circuit board 60 that allows the liquefied polymeric material to flow entirely through the gap between the heat sink 38 and the top surface 70 of the printed circuit board 60 and partially about the outer perimeter or flange 90 of the heat sink 38 during the injection molding step. Therefore the printed circuit board facing surface 102 and the outer perimeter or flange 90 of the heat sink 38 are at least partially overmolded with polymeric material to fix the heat sink 38 in the position shown. The polymeric material of the housing 32 which flows into the predetermined spacing 82 provides a more efficient heat transfer path between heat producing components on the printed circuit board 60 and the external environment than provided by air in the same gap. At this time the printed circuit board assembly 100, except for the exposed portion 98 of the heat sink 38 having the cooling fins 92 is also overmolded with the polymeric material which creates the substantially solid inner body 62 of the housing 32.

The completed motor electronics unit 12 is removed from the mold after a cooling period of approximately 90 seconds. The exposed portion 98 of the heat sink 38 having the cooling fins 92 extends outwardly of an endcap 104 of the motor electronics unit 12 also co-molded at the same time and of the same polymeric material as the housing 32. The exposed portion 98 of the heat sink 38 is therefore exposed to atmosphere to permit heat transfer from the electronics components mounted on the printed circuit board 60, now overmolded by the substantially solid inner body 62 of the housing 32 to atmosphere.

Referring to FIG. 7 and again to FIGS. 3 through 8, the completed motor electronics unit 12 is mounted to the motor 14 as follows. The three cross contacts 94 are individually fixed to one of each of three motor terminals 106. A gasket 108 is placed within a gasket slot 110 created in the motor mounting flange 18 of the motor 14. Each of the three motor electrical output conductors 80, 80', 80" are aligned with and frictionally engaged in one of the three cross contacts 94 until the mounting flange 34 of the motor electronics unit 12 seats on the motor mounting flange 18 of the motor 14, thereby compressing the gasket 108. A motor shaft 112 of the motor 14 includes a magnet 114 used for sending motor operation.

Figure 7:
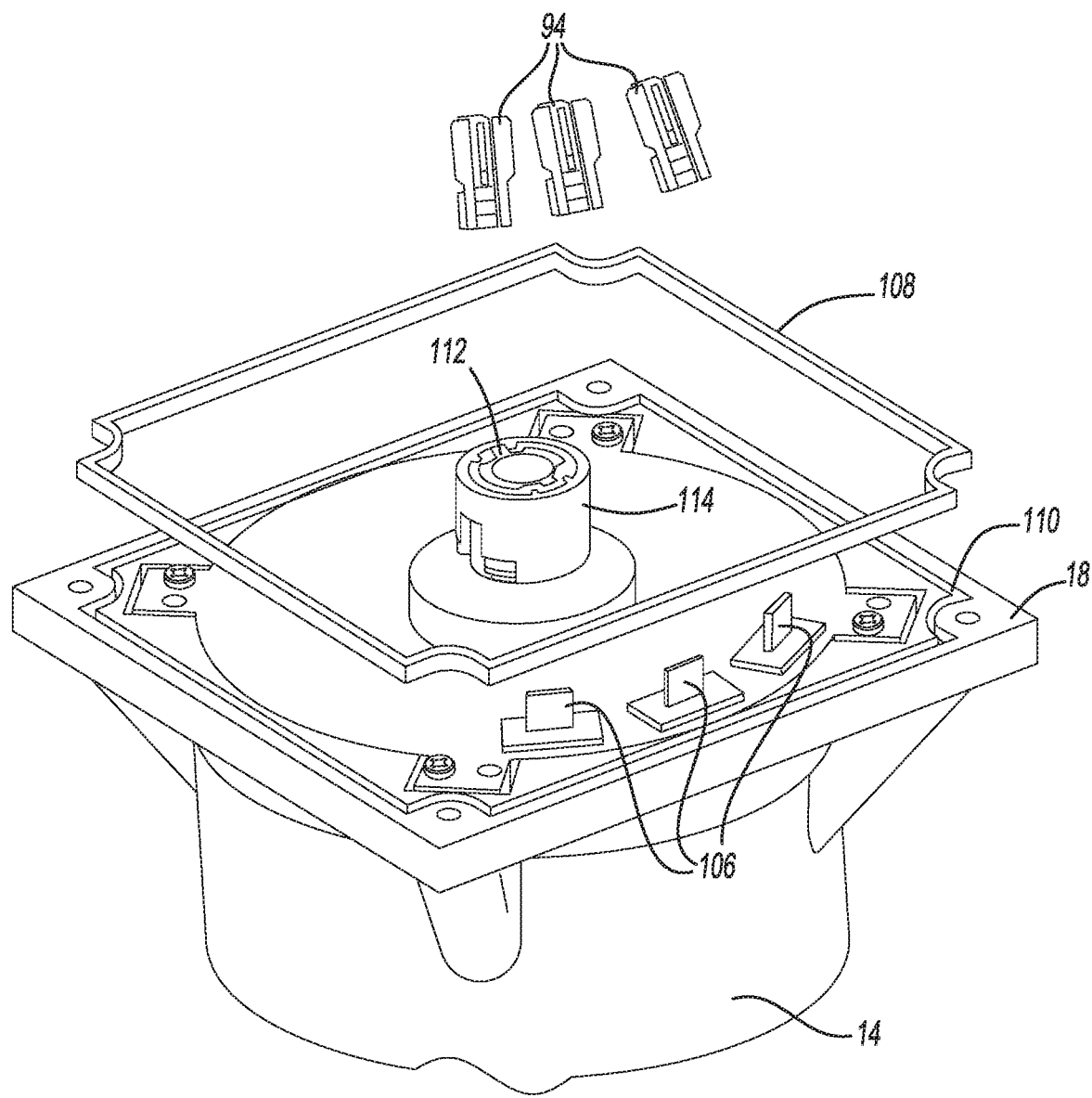
FIG. 7 is a front perspective assembly view of the motor prior to installation of the motor electronics unit.

Referring to FIG. 8 and again to FIG. 7, installation of the motor electronics unit 12 onto the motor 14 is completed by extending the fasteners 20 through the apertures 36 of the mounting flange 34 and threadingly engaging the fasteners to the motor mounting flange 18 to retain the motor electronics unit 12. The seated gasket 108 provides a fluid boundary between the motor 14 and the motor electronics unit 12.

With continuing reference to FIGS. 3 and 6, a sensor 116 is positioned on the second side 96 of the printed circuit board 60 for sensing a position of the motor shaft 112 using the magnet 114. According to several aspects, the sensor 116 is a Hall Effect sensor having a portion of the sensor 116 exposed, defined as not overmolded with the material of the substantially solid inner body 62 of the housing 32. The substantially solid inner body 62 of the housing 32 includes a recess 118 extending from the motor cavity 68 for receiving a portion of the motor shaft 112, with the sensor 116 positioned proximal to the recess 118 such that the sensor 116 is not encapsulated by the material of the substantially solid inner body 62 of the housing 32.

A motor electronics unit 12 of the present disclosure offers several advantages. These include protection of components of the populated printed circuit board from the environment, provision of a more efficient heat transfer path between heat producing components on the printed circuit board and the external environment, elimination of a gap pad or heat transfer device required between the printed circuit board and the heat sink, and provision of a pre-molded shroud mounted to the printed circuit board which is encapsulated by the molded housing. In addition, the environmental seal located between a traditional housing and the electrical connectors is eliminated.

The description of the present disclosure is merely exemplary in nature and variations that do not depart from the gist of the present disclosure are intended to be within the scope of the present disclosure. Such variations are not to be regarded as a departure from the spirit and scope of the present disclosure.

What is claimed is:

1. A motor electronics unit, comprising:
  a printed circuit board having a first side and a second side;
  at least one electrical conductor connected to the printed circuit board;
  a heat sink positioned proximate to the printed circuit board;
  a pre-molded electrical connector shroud having a portion of the at least one electrical conductor positioned within the electrical connector shroud; and
  a housing molded from a low pressure injection molded thermally conductive polymeric material, the housing including a first side and a side surface, wherein first side of the housing is proximal to the first side of the printed circuit board and is distal to the second side of the printed circuit board,
  wherein the housing encapsulates the printed circuit board such that the printed circuit board is fixed within a substantially solid inner body of the housing, wherein the pre-molded electrical connector shroud extends longitudinally away from the first side of the housing.

2. The motor electronics unit of claim 1, wherein a second section of the electrical connector shroud extends out from an end surface of the housing and freely away from the housing.

3. The motor electronics unit of claim 1, wherein a first section of the electrical connector shroud defines a flange extending around a perimeter of the electrical connector shroud.

4. The motor electronics unit of claim 3, wherein the flange includes a step.

5. The motor electronics unit of claim 1, wherein the at least one electrical conductor defines first and second input electrical power conductors supplying power to the printed circuit board.

6. The motor electronics unit of claim 1, wherein the at least one electrical conductor defines multiple pins transmitting communication signals.

7. The motor electronics unit of claim 1, wherein a first portion of the heat sink defining a flange is overmolded to fix the heat sink to the printed circuit board, and a second portion of the heat sink extends outward from an end surface of the housing, the second portion having multiple fins.

8. The motor electronics unit of claim 1, wherein the housing includes a housing portion filling a gap between the printed circuit board and the heat sink.

9. The motor electronics unit of claim 1, wherein: a portion of the at least one electrical conductor is encapsulated by the substantially solid inner body.

10. The motor electronics unit of claim 1, wherein: the substantially solid inner body has a motor cavity receiving an electrical motor when the motor electronics unit is connected to the electrical motor; and the housing includes a cross contact positioned within the motor cavity and connected to the at least one electrical conductor and to the motor electrically that electrically connects the printed circuit board to the electrical motor.

11. The motor electronics unit of claim 1, wherein the pre-molded electrical connector shroud is connected to the housing via an epoxy layer, wherein the at least one electrical conductor extends through the epoxy layer and the substantially solid inner body.

12. The motor electronics unit of claim 1, wherein the substantially solid inner body defines a recess such that a sensor positioned on the second side of the printed circuit board is exposed to sense a position of a motor shaft, wherein the recess extends from a motor cavity such that a portion of the motor shaft can extend through the recess.

13. A motor electronics unit, comprising:
  a printed circuit board having a first side and a second side and having electronic components connected to the printed circuit board; at least one electrical conductor connected to the printed circuit board;
  a heat sink connected to the printed circuit board;
  a pre-molded electrical connector shroud having a portion of the at least one electrical conductor positioned within the pre-molded electrical connector shroud;
  a housing having an endcap, a first side, and a second side, both the housing and the endcap co-molded in a low pressure injection molding process of a thermally conductive polymeric material, wherein the first side is proximal to the first side of the printed circuit board and is distal to the second side of the printed circuit board, wherein:

the endcap encapsulates the printed circuit board including the electronic components connected to the printed circuit board and covers a first portion of the heat sink, with a second portion of the heat sink uncovered by the polymeric material of the endcap to permit heat transfer away from the printed circuit board; and the endcap encapsulates a portion of the electrical connector shroud, wherein the pre-molded electrical connector shroud extends longitudinally along an axis defined as perpendicular to the first side of the housing.

14. The motor electronics unit of claim 13, wherein the endcap encapsulates a first section of the at least one electrical conductor.

15. The motor electronics unit of claim 14, wherein:
the housing includes a substantially solid inner body; and
a second section of the at least one electrical conductor is encapsulated by the substantially solid inner body.

16. The motor electronics unit of claim 13, wherein:
the endcap extends in a direction perpendicular to the printed circuit board; and
the heat sink includes a step portion completely encapsulated by the endcap.

17. The motor electronics unit of claim 13, wherein the first side of the printed circuit board includes at least one field-effect transistor positioned in a predetermined area and electrically connected to the at least one electrical conductor, with the heat sink positioned above the predetermined area.

18. A motor electronics unit, comprising:
a printed circuit board having a first side and a second side and having electronic components connected to the printed circuit board;
at least one electrical conductor connected to the first side of the printed circuit board;
a heat sink connected to the first side of the printed circuit board;
a pre-molded electrical connector shroud having a portion of the at least one electrical conductor positioned within the electrical connector shroud; and
a housing having an endcap, a first side, and a second side, both the housing and the endcap co-molded in a low pressure injection molding process of a thermally conductive polymeric material, wherein the first side is proximal to the first side of the printed circuit board and is distal to the second side of the printed circuit board, wherein:
the endcap encapsulates the printed circuit board including the electronic components connected to the printed circuit board and covers a first portion of the heat sink, with a second portion of the heat sink uncovered by the polymeric material of the endcap to permit heat transfer away from the printed circuit board;
the endcap encapsulates a portion of the electrical connector shroud; and
the endcap encapsulates a first section of the at least one electrical conductor;
wherein the at least one electrical conductor extends from an inner surface of the housing and does not extend beyond a mating surface of the housing,
wherein the housing encapsulates the printed circuit board such that the printed circuit board is fixed within a substantially solid inner body of the housing, wherein the pre-molded electrical connector shroud extends longitudinally away from the first side of the housing.

* * * * *